United States Patent
Li et al.

(10) Patent No.: US 10,707,289 B2
(45) Date of Patent: Jul. 7, 2020

(54) FLEXIBLE DISPLAY PANEL AND FLEXIBLE DISPLAY

(71) Applicant: Wuhan China Star Optoelectronics Semiconductor Display Technology Co., Ltd., Wuhan (CN)

(72) Inventors: Shuang Li, Shenzhen (CN); Liang Sun, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/111,233

(22) Filed: Aug. 24, 2018

(65) Prior Publication Data

US 2019/0245025 A1    Aug. 8, 2019

Related U.S. Application Data

(63) Continuation of application No. PCT/CN2018/079546, filed on Mar. 20, 2018.

(30) Foreign Application Priority Data

Feb. 8, 2018    (CN) .......................... 2018 1 0131234

(51) Int. Cl.
*H01L 29/18*    (2006.01)
*H01L 33/00*    (2010.01)
(Continued)

(52) U.S. Cl.
CPC ...... *H01L 27/3276* (2013.01); *H01L 51/0097* (2013.01); *H01L 51/5237* (2013.01); *H01L 51/5253* (2013.01); *H01L 2251/5338* (2013.01)

(58) Field of Classification Search
None
See application file for complete search history.

(56) References Cited

U.S. PATENT DOCUMENTS

2014/0307396 A1    10/2014   Lee
2015/0138103 A1*    5/2015   Nishi .................. G02F 1/13452
                                              345/173
(Continued)

FOREIGN PATENT DOCUMENTS

CN    106449695 A    2/2017
CN    106847871 A    6/2017
(Continued)

OTHER PUBLICATIONS

Chinese First Office Action,Chinese Application No. 201810131234.8, dated Mar. 27, 2020 (7 pages).

*Primary Examiner* — Calvin Y Choi

(57) ABSTRACT

The present disclosure discloses a flexible display panel and a flexible display. The flexible display panel includes a flexible substrate with at least one bendable side, the flexible substrate comprises a display area and a drive controller, the flexible display panel of the present disclosure adjusts the aspect ratio by changing the structure of the drive controller, thereby shortening the length of the drive controller along the direction parallel to the bend line in the bend area, effectively avoiding defects of the structure of the drive controller on the flexible display panel, also increasing the viewing angle. In addition, in order to save the space, the flexible substrate connected to the drive controller is bent to the other side of the flexible substrate to make the drive controller drive the light emission of the display panel, which greatly reduces the volume of the flexible panel.

20 Claims, 4 Drawing Sheets

(51) Int. Cl.
 *H01L 27/32* (2006.01)
 *H01L 51/00* (2006.01)
 *H01L 51/52* (2006.01)

(56) References Cited

U.S. PATENT DOCUMENTS

| | | |
|---|---|---|
| 2017/0023979 A1* | 1/2017 | Yamazaki .............. G06F 1/1652 |
| 2017/0040406 A1* | 2/2017 | Park .................... H01L 27/3276 |
| 2017/0194580 A1 | 7/2017 | Lee |
| 2017/0229673 A1 | 8/2017 | Andou |
| 2018/0014406 A1 | 1/2018 | Yang et al. |
| 2018/0033979 A1* | 2/2018 | Jang ........................ H01L 51/56 |
| 2018/0286293 A1 | 10/2018 | Liu |

FOREIGN PATENT DOCUMENTS

| | | |
|---|---|---|
| CN | 107112348 A | 8/2017 |
| KR | 20140108827 A | 9/2014 |

\* cited by examiner

FLEXIBLE DISPLAY PANEL AND FLEXIBLE DISPLAY

CROSS-REFERENCE TO RELATED APPLICATIONS

This is a continuation of International Application PCT/CN2018/079546, with an international filing date of Mar. 20, 2018, which claims foreign priority of Chinese Patent Application No. 201810131234.8, filed on Feb. 8, 2018 in the State Intellectual Property Office of China, the contents of all of which are hereby incorporated by reference.

TECHNICAL FIELD

The present disclosure relates to display technology, and in particular to a flexible display panel and a flexible display.

BACKGROUND

Compared with the traditional LCD display panel, the active-matrix organic light emitting diode (AMOLED) display panel is a self-emission device, so it has a faster response time, low power consumption, wide viewing angle, and wide color domains, ultra-thin, and other display product advantages.

In addition, another advantage of AMOLED display panel is the use of flexible substrate and thin film encapsulation technology to achieve flexible panel display. With the development of panel technology, flexible display technology has become more and more popular among consumers. Because compared with the traditional hard screen display, the flexible display has the advantages of being more portable, more in line with human body design and visual aesthetic. However, since the drive controller is a device made of non-bending material, which is provided in a long strip shape and has a long length, the bending range on both sides of the display panel is greatly limited.

SUMMARY

The technical problem solved by the present disclosure is to provide a flexible display panel and a flexible display, which can avoid effectively defects of the small bending range of the flexible display panel by optimizing the structure of the drive controller.

In order to solve the technical problem mentioned above, the present disclosure provides a flexible display panel including a flexible substrate includes a display area and a bend area with a bend line, the bend area capable of bending downwards along the bend line, a drive controller disposed on the bend area, the bend area and the display area are on the same surface of the flexible substrate; a ratio of a length of the drive controller along a direction parallel to a bend line in the bend area to a length of the drive controller along a direction perpendicular to the bend line is less than 10; a ratio of the length of the drive controller along the direction parallel to the bend line in the bend area and a length of the bend line is less than ⅔; an encapsulation material; a flexible circuit board disposed on an end of the bend area far away from the display area for transmitting signal; and a support plate disposed on the flexible substrate for supporting the flexible substrate and the encapsulation material; the flexible substrate defines two side bend lines, the display area is divided into two edge areas and a middle area by the side bend lines, the edge areas and the middle are configured to display image at the same time.

In order to solve the technical problem mentioned above, the present disclosure provides a flexible display panel including a flexible substrate includes a display area and a bend area with a bend line, the bend area capable of bending downwards along the bend line; a drive controller disposed on the bend area, the bend area and the display area are on the same surface of the flexible substrate; a ratio of a length of the drive controller along a direction parallel to a bend line in the bend area to a length of the drive controller along a direction perpendicular to the bend line is less than 10.

In order to solve the technical problem mentioned above, the present disclosure provides a flexible display, the flexible display includes the above flexible display panel.

The benefit effects of the present disclosure are: different from the prior art, the flexible display panel of the present disclosure adjusts the aspect ratio by changing the structure of the drive controller, thereby shortening the length of the drive controller along the direction parallel to the bend line in the bend area, effectively avoiding defects of the structure of the drive controller on the flexible display panel, also increasing the viewing angle. In addition, in order to save the space, the flexible substrate connected to the drive controller is bent to the other side of the flexible substrate to make the drive controller drive the light emission of the display panel, which greatly reduces the volume of the flexible panel.

DETAILED DESCRIPTION

To make the objectives, technical solutions, and beneficial technical effects of the present disclosure clearer and more comprehensible, the following clearly describes the technical solutions in the embodiments of the present disclosure in connection with the drawings in the embodiments of the present disclosure. Obviously, the described embodiments are merely a part of the embodiments of the present disclosure and not all of them. Based on the embodiments of the present disclosure, all other embodiments can be obtained by those skilled in the art without making any creative work are within the scope of the protection of the present disclosure.

Figure 1:
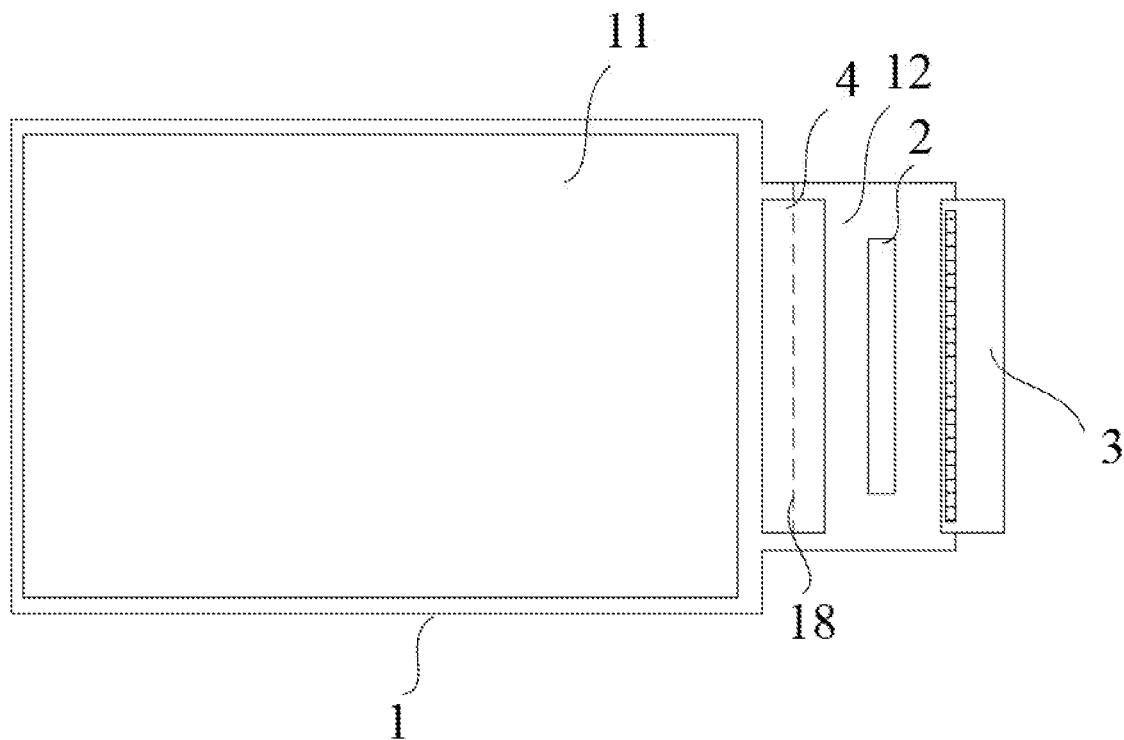
FIG. 1 is a structural schematic diagram of an unfolded flexible display panel according to an embodiment of the present disclosure.

Referring to FIG. 1, FIG. 1 is a structural schematic diagram of an unfolded flexible display panel according to an embodiment of the present disclosure. The flexible display panel includes a flexible substrate 1, a drive controller 2, a flexible circuit board 3, an encapsulation material 4, and a display area 11. The flexible display panel in this embodiment is mainly used for active-matrix organic light emitting diode (AMOLED).

At least one side of the flexible substrate 1 can be bent. The flexible substrate 1 has a display area 11 and a bent area 12. A drive controller 2 is disposed on the bend area 12 of the flexible substrate 1. The bend area 12 and the display area 11 are on the same surface of the flexible substrate 1. The flexible circuit board 3 is disposed outer edge of the bend area 12 far away from the display area 11 for signal transmission. The display area 11 contains luminescent materials that emit light when current passes through them.

In one embodiment, the opposite sides of the display area 11 of the flexible substrate 1 in FIG. 1 that are not connected to the bend area 12 may be bent outwards, on one baud to make the appearance more beautiful, and on the other hand to increase the viewing angle.

In this embodiment, in order to fix the drive controller 2 on the flexible substrate 1 without breaking. A ratio of the length of the drive controller 2 along a direction parallel to a bend line 18 in the bend area 12 to the length along a direction perpendicular to the bend line 18 is less than 10. The size of the drive controller 2 is adjusted by adjusting the ratio of the length of the drive controller 2 along the direction parallel to the bend line 18 in the bend area 12 and the length along the direction perpendicular to the bend line 18, that is, adjusting the aspect ratio of the drive controller 2. The area occupied by the drive controller 2 is fixed or varies within a threshold range. The smaller the ratio of the length along the direction parallel to the bend line 18 in the bend area 12 and the length along the direction perpendicular to the bend line 18 is, the smaller the length of the device 2 along the direction parallel to the bend line 18 in the bend area 12 is, the larger the portions where the upper and lower sides of the display area 11 can be bent are. The ratio of the length of the drive controller 2 along the direction parallel to the bend line 18 in the bend area 12 and the length of the bend line 18 is less than ⅔.

Figure 2:
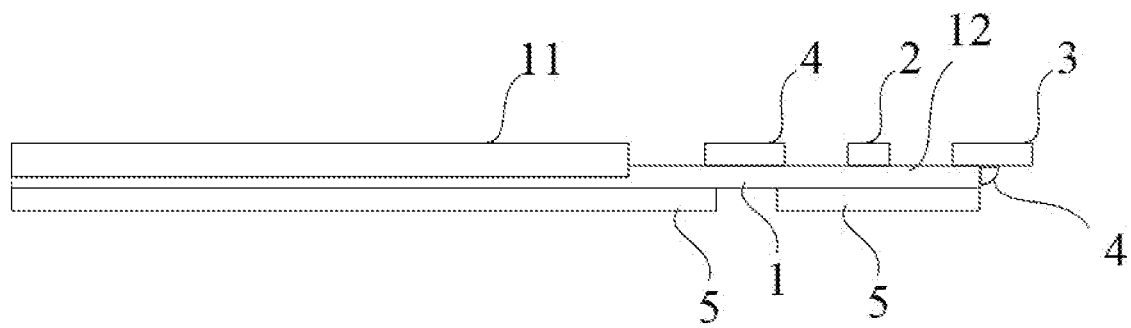
FIG. 2 is a side view of the unfolded flexible display panel in FIG. 1.

Please refer to FIG. 2, FIG. 2 is a side view of the unfolded flexible display panel in FIG. 1. As shown in the figure, the display area 11, the encapsulation material 4, the drive controller 2, and the flexible circuit board 3 are disposed on the upper side of the flexible substrate 1 in order from left to right. A plurality of support plates 5 are arranged on the lower side of the flexible substrate 1 for supporting the flexible substrate 1 and the encapsulation material 4. A part of the encapsulation material 4 is disposed between the display area 11 and the bend area 12 of the flexible substrate 1, and another part of the encapsulation material 4 is disposed on the connecting end of the flexible circuit board 3 and the bend area 12 of the flexible substrate 1. The flexible display panel is made by a thin film encapsulation technology.

In one embodiment, the encapsulation material 4 is selected from Ultraviolet Rays glue (abbreviated to UV); the UV glue is also called photosensitive glue and UV-curable glue. The UV glue is an adhesive that must be cured by ultraviolet light irradiation. It should be noted that the position where the encapsulation material 4 is disposed in this embodiment is only to illustrate the encapsulation material 4 needed here and is not a limitation on the position of the encapsulation material.

Figure 3:
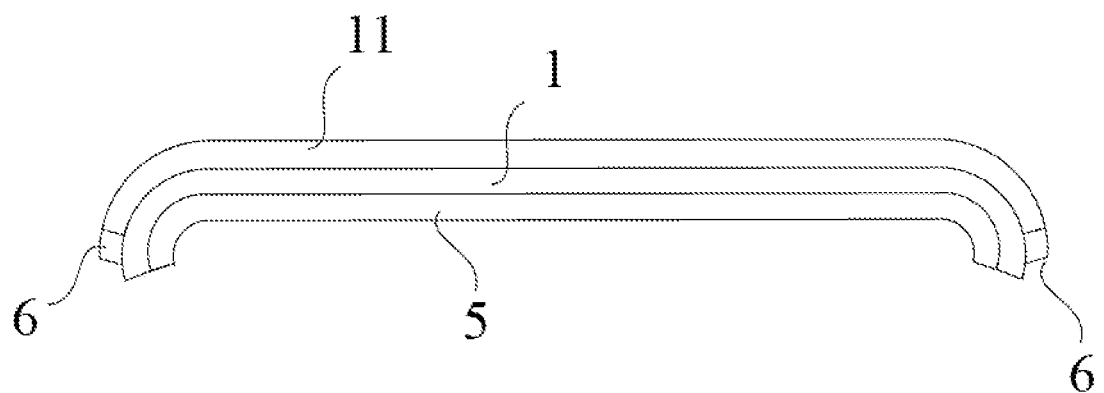
FIG. 3 is a side view of the flexible display panel in FIG. 1 with both sides bent.

Please referring to FIG. 3, FIG. 3 is a side view of the flexible display panel in FIG. 1 with both sides bent. A peripheral drive circuit 6 is disposed on the periphery of the display area 11 of the flexible substrate 1, and the peripheral drive circuit 6 is used to control the display area 11. The supporting plate 5 at the bottom of the flexible substrate 1 can be appropriately adjusted according to the bending degree of the flexible substrate 1 to support the encapsulation material 4 on the flexible substrate 1 and the flexible substrate 1. The peripheral drive circuit 6 mainly includes a row drive circuit and a column drive circuit. After receiving the external signal, the row drive circuit and the column drive circuit control the light emitting material in the display area 11 to emit light according to the signal.

In order to save the space, the flexible substrate 1 connected with the drive controller 2 is bent to the other side of the flexible substrate 1 to make the drive controller 2 drive the display panel to emit light. Please further referring to FIG. 4, FIG. 4 is a structural schematic view of the flexible display panel in FIG. 1 after being bent downward.

Figure 4:
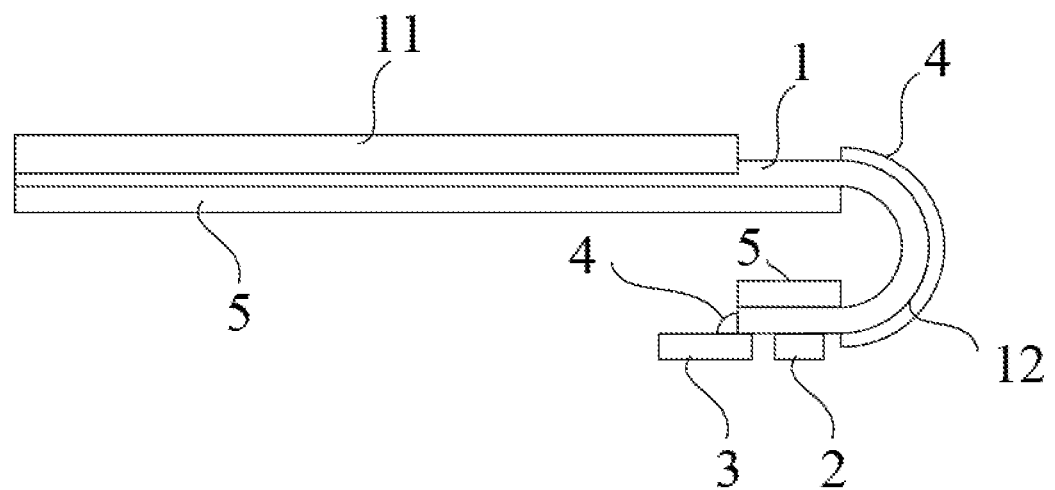
FIG. 4 is a structural schematic view of the flexible display panel in FIG. 1 after being bent downward.

As shown in FIG. 4, the bend area 12 of the flexible substrate 1 is bent downward. The encapsulation material 4 is disposed on the bend area 12, and the drive controller 2 is disposed on the bend area 12 bent downward of the flexible substrate 1, the bend area 12 and the display area 11 are on the same surface of the flexible substrate 1. The flexible circuit board 3 is fixed on the outer edge of the bend area 12 by the encapsulation material 4 for transmitting signals. A plurality of support plates 5 are provided on the lower side of the flexible substrate 1 for supporting the flexible substrate 1 and the encapsulation material 4. The display area 11 is disposed above the bent area 12 of the flexible substrate 1.

In one embodiment, the display area 11 is defined in a first curved surface, and the bend area 12 is defined in a second curved surface different from the first curved surface. The distance from a point on the first curved surface to a corresponding point on the second surface is fixed and the same. The flexible circuit board 3 is connected to an external circuit through a bend area 12 bent on the flexible substrate 1. The drive controller 2 is directly disposed on the bend area 12 and is on the same surface of the flexible substrate 1 as the display area 11, which greatly reduces the space of the module mechanism of the flexible display panel.

The drive controller 2, also known as the drive IC, is the main pan of the display panel for imaging>, for the drive controller 2 has functions of driving the display panel and controlling the drive current, etc.

Figure 5:
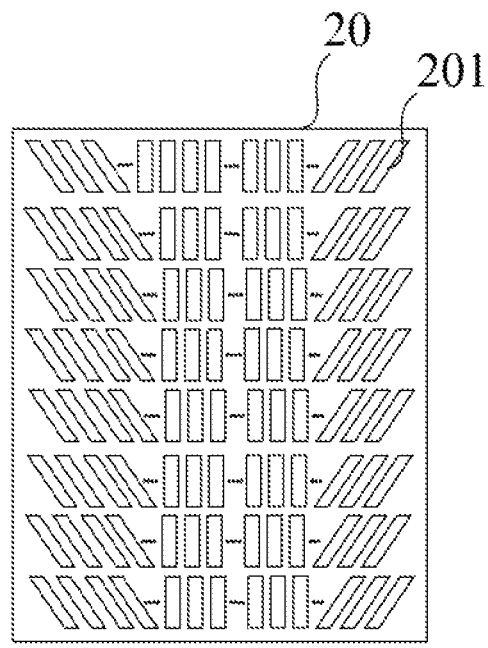
FIG. 5 is a structural schematic diagram of a drive controller of a flexible display panel according to an embodiment of the present disclosure.
Figure 6:
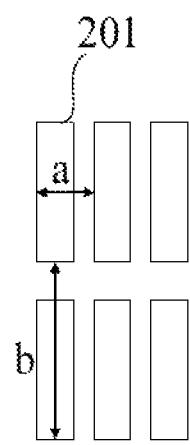
FIG. 6 is a schematic diagram of the pin arrangement of the drive controller in FIG. 5.

Please referring to FIG. 5, FIG. 5 is a structural schematic diagram of a drive controller of a flexible display panel according to an embodiment of the present disclosure. In this embodiment, the drive controller 20 is directly disposed on the surface of the flexible substrate (not shown) and not through a flexible circuit board (not shown). A plurality of pins 201 are evenly formed on the drive controller 20. In order to reduce the length of the drive controller 20 along the direction parallel to the bend line in the bend area, in this embodiment, the ratio of the length of the drive controller 20 along the direction parallel to the bend line in the bend area to the length along the direction perpendicular to the bend line is less than 10, that is, the number of pins 201 of the drive controller 20 along the direction perpendicular to the bend line is increased, and the number of pins 201 of the drive controller along the direction parallel to the bend line in the bend area is decreased. In addition, as shown in FIG. 6, FIG. 6 is a schematic diagram of the pin arrangement of the drive controller in FIG. 5. Adjusting the aspect ratio of the drive controller 20 can also be achieved by adjusting the pitch of the pins 201 of the drive controller 20. Specifically, the pitch of each pin 201 along the direction parallel to the bend line is a, and the pitch of each pin 201 along the direction perpendicular to the bend line is b. Adjustment of the length of the drive controller 20 is achieved by reducing the pitch of the pin 201 along the direction parallel to the bend line.

Further, taking a full high definition (abbreviated as FHD) 1080×2160 resolution as aa example, there are 2.160 data lines in the drive controller, and the required signal input ends of the peripheral drive circuit. The number of the plus is at least (1080+10)*2 on the flexible display panel. A space of about 38.15 mm*1.3 mm is reserved on the flexible display panel in the prior art. In the present embodiment, the pitch of each pin in the drive controller along the direction parallel to the bend line in the bend area is set to be 650 um, and the pitch along the direction perpendicular to the bend line is 35 um, to increase the number of pins in the drive controller along the direction perpendicular to the bend line, to reduce the number of pins in the drive controller along the direction parallel to the bend line in the bend area, the length of the drive controller along the direction parallel to the bend line in bend area is 9.6 mm after adjusted, the length of the drive controller along the direction perpendicular to the bend line is 5.2 mm and the size is 9.6 mm*5.2 mm. Thus, can obtain the ratio of the length of the drive controller along the direction parallel to the bend line in the bend area and the length along the direction perpendicular to the bend line is 1.846, which is less than the preset value, that is, the drive controller can be directly fixed on the surface of the flexible substrate.

Figure 7:
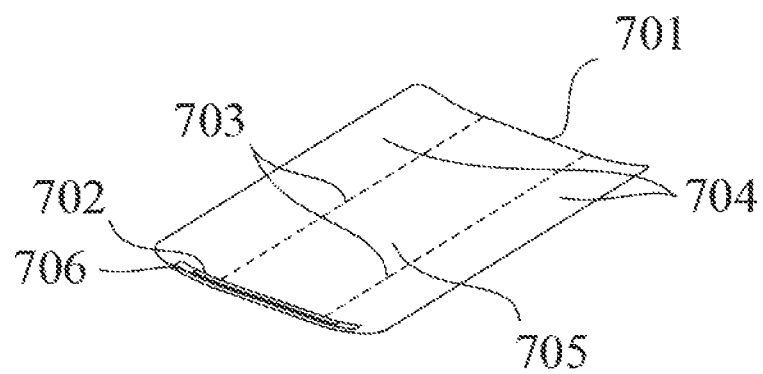
FIG. 7 is a structural schematic diagram of a flexible display panel according to another embodiment of the present disclosure.

In a specific embodiment, as shown in FIG. 7, FIG. 7 is a structural schematic diagram of a flexible display panel according to another embodiment of the present disclosure. The flexible substrate 701 defines two side bend lines 703. A display area is defined in the bottom surface of the flexible substrate 701. The display area is divided into two edge areas 704 and a middle area 705 by the side bend lines 703. The edge areas 704 and the middle area 705 are used for image display at the same time. It should be noted that both the edge areas 704 and the middle area 705 are on the display area of the bottom surface of the flexible substrate 701. The drive controller 702 is directly fixed on the bend area 706 of the flexible substrate 701, because the ratio of the length of the drive controller 702 along the direction parallel to the bend line in the bend area 706 to the length along the direction perpendicular to the bend line 703 is less than 10, and the drive controller 702 can be directly fixed on the surface of the flexible substrate 701. It should be noted that the specific position of the side bend line 703 is determined according to the aspect ratio of the drive controller 702, if the smaller the ratio of the length of the drive controller 702 along the direction parallel to the bend line in the bend area 706 and the length along the direction perpendicular to the bend line 703 is, the larger the range of the side bend line 703 sets.

Figure 8:
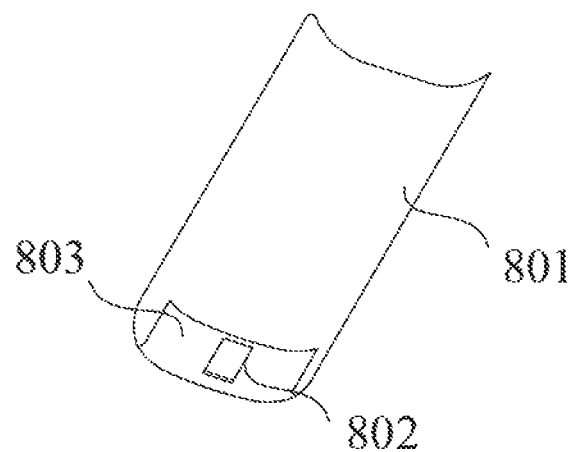
FIG. 8 is a structural schematic diagram of a flexible display panel according to still another embodiment of the present disclosure.

In another specific embodiment, since the ratio of the length of the drive controller along the direction parallel to the bend line in the bend area to the length along the direction perpendicular to the bend line is smaller, the range set by the side bend lines is larger. When the ratio is less than 2, the range set by the side bend lines includes the entire surface of the flexible substrate, and the 3D curved surface can be bent. The 3D curved surface bending means a flexible substrate curved in the middle and edge. This kind of 3D curved surface bending has a multi-shape appearance, and it has special design novelty and good texture. Specifically, as shown in FIG. 8, FIG. 8 is a structural schematic diagram of a flexible display panel according to still another embodiment of the present disclosure. The flexible substrate 801 is a 3D curved surface bending. The bend area 803 of the flexible substrate 801 sets with a drive controller 802. The ratio of the length of the drive controller 802 along the direction parallel to the bend line in the bend area 805 to the length along the direction perpendicular to the bend line is less than 2, that is, under the premise that the material of the drive controller 802 is not changed, the drive controller 802 can be directly on the surface of the flexible substrate to realize 3D curved surface bending.

Different from the prior art, the flexible display panel of the present embodiment adjusts the aspect ratio by changing the structure of the drive controller, thereby shortening the length of the drive controller along the direction parallel to the bend line in the bend area, effectively avoiding the structural defects of the drive controller on the flexible display panel, but also increase the viewing angle. In addition, in order to save the space, the flexible substrate connected to the drive controller is bent to the other side of the flexible substrate to make the drive controller drive the light emission of the display panel, which greatly reduces the volume of the flexible panel.

Figure 9:
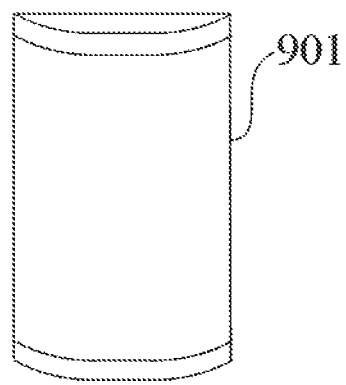
FIG. 9 is a structural schematic diagram of a flexible display according to an embodiment of the present disclosure.

Please referring to FIG. 9, FIG. 9 is a structural schematic diagram of a flexible display according to an embodiment of the present disclosure. The flexible display 901 includes any of the above-described flexible display panels of the present disclosure. Due to the adoption of die above flexible display panel, the length of the drive controller along the direction parallel to the bend line in the bend area is shortened, the structural defect of the drive controller on the flexible display panel is effectively avoided, and the viewing angle is also increased. In addition, in order to save the space, the flexible substrate connected is bent to the drive controller to the other side of the flexible substrate to make the drive controller drive the light emission of the display panel, which greatly reduces the volume of the flexible panel. For a specific structure, reference may be made to the flexible display panel in any of the foregoing embodiments shown in FIG. 1-8, and details are not described herein again.

It should be noted that the foregoing embodiments all belong to a same inventive concept. The description of each embodiment has its own emphasis. In the individual embodiments, the details are not described, and reference may be made to the description in other embodiments.

The above description is merely the embodiments of the present disclosure, does not limit the scope of the present disclosure. Any equivalent structure or flow transformations made by the description and the drawing of the present disclosure, or any direct or indirect applications of the disclosure on other related fields, shall all be covered within the protection of the disclosure.

What is claimed is:

1. A flexible display panel, comprising:
a flexible substrate comprising a display area and a bend area with a bend line, the bend area capable of bending downwards along the bend line; a drive controller disposed on the bend area, wherein the bend area and the display area are on the same surface of the flexible substrate; a ratio of a length of the drive controller along a direction parallel to a bend line in the bend area to a length of the drive controller along a direction perpendicular to the bend line is less than 10; a ratio of the length of the drive controller along the direction parallel to the bend line in the bend area and a length of the bend line is less than ⅔; the drive controller comprises a first group of pins, a second group of pins, a third group of pins, and a fourth group of pins arranged successively along the direction parallel to the bend line; each pin of the first group of pins is angled from each pin of the second group of pins, and each pin of the fourth group of pins is angled from each pin of the third group of pins;
an encapsulation material;
a flexible circuit board disposed on an end of the bend area far away from the display area for transmitting signal; and
a plurality of support plates disposed on the flexible substrate for supporting the flexible substrate and the encapsulation material; the encapsulation material is disposed at one side of the flexible substrate, and the plurality of support plates are disposed at the other side of the flexible substrate opposite to the encapsulation material; the plurality of support plates are spaced apart from each other with a gap; the encapsulation material is disposed between the display area and the drive controller and spaced apart from the display area and the drive controller, and a projection of the encapsulation material projected on the plurality of support plates covers the gap;
wherein the flexible substrate defines two side bend lines, the display area is divided into two edge areas and a middle area by the side bend lines, the edge areas and the middle are configured to display image at the same time.

2. The flexible display panel according to claim 1, wherein the display area is defined in a first curved surface, and the bend area is defined in a second curved surface different from the first curved surface, the distance from a point on the first curved surface to a corresponding point on the second curved surface is fixed and the same.

3. A flexible display panel, comprising:
a flexible substrate comprises a display area and a bend area with a bend line, the bend area capable of bending downwards along the bend line; a drive controller disposed on the bend area, the bend area and the display area are on the same surface of the flexible substrate; wherein the drive controller comprises a first group of pins, a second group of pins, a third group of pins, and a fourth group of pins arranged successively along the direction parallel to the bend line; each pin of the first group of pins is angled from each pin of the second group of pins, and each pin of the fourth group of pins is angled from each pin of the third group of pins;
an encapsulation material; and
a plurality of support plates disposed on the flexible substrate for supporting the flexible substrate and the encapsulation material; the encapsulation material is disposed at one side of the flexible substrate, and the plurality of support plates are disposed at the other side of the flexible substrate opposite to the encapsulation material; the plurality of support plates are spaced apart from each other with a gap, the encapsulation material is disposed between the display area and the drive controller and spaced apart from the display area and the drive controller, and a projection of the encapsulation material projected on the plurality of support plates covers the gap;
wherein a ratio of a length of the drive controller along a direction parallel to a bend line in the bend area to a length of the drive controller along a direction perpendicular to the bend line is less than 10.

4. The flexible display panel according to claim 3, wherein the flexible display panel further comprises:
a flexible circuit board disposed on an end of the bend area far away from the display area for transmitting signal.

5. The flexible display panel according to claim 3, wherein a ratio of the length of the drive controller along the direction parallel to the bend line in the bend area and a length of the bend line is less than ⅔.

6. The flexible display panel according to claim 3, wherein the flexible substrate defines two side bend lines, the display area is divided into two edge areas and a middle area by the side bend lines, the edge areas and the middle are configured to display image at the same time.

7. The flexible display panel according to claim 6, wherein the display area is defined in a first curved surface, and the bend area is defined in a second curved surface different from the first curved surface, the distance from a point on the first curved surface to a corresponding point on the second curved surface is fixed and the same.

8. The flexible display panel according to claim 3, wherein a peripheral drive circuit is disposed on the periphery of the display area, and the peripheral drive circuit is used to controls the display area.

9. The flexible display panel according to claim 3, wherein the flexible substrate is a 3D curved surface bending.

10. The flexible display panel according to claim 3, wherein the drive controller comprises a plurality of pins, a pin pitch along the direction parallel to the bend line in the bend area is 650 um, and a pin pitch along the direction perpendicular to the bend line is 35 um.

11. The flexible display panel according to claim 10, wherein the length of the driver controller along the direction parallel to the bend line in the bend area is 9.6 mm, and the length of the drive controller along the direction perpendicular to the bend line is 5.2 mm.

12. A flexible display, comprising a flexible display panel, the flexible display comprising:
a flexible substrate comprises a display area and a bend area with a bend line, the bend area capable of bending downwards along the bend line; a drive controller disposed on the bend area, the bend area and the display area are on the same surface of the flexible substrate; wherein the drive controller comprises a first group of pins, a second group of pins, a third group of pins, and a fourth group of pins arranged successively along the direction parallel to the bend line; each pin of the first group of pins is angled from each pin of the second group of pins, and each pin of the fourth group of pins is angled from each pin of the third group of pins;
an encapsulation material; and
a plurality of support plates disposed on the flexible substrate for supporting the flexible substrate and the encapsulation material; the encapsulation material is disposed at one side of the flexible substrate, and the plurality of support plates are disposed at the other side of the flexible substrate opposite to the encapsulation material; the plurality of support plates are spaced apart from each other with a gap, the encapsulation material is disposed between the display area and the drive controller and spaced apart from the display area and the drive controller, and a projection of the encapsulation material projected on the plurality of support plates covers the gap;
wherein a ratio of a length of the drive controller along a direction parallel to a bend line in the bend area to a length of the drive controller along a direction perpendicular to the bend line is less than 10.

13. The flexible display according to claim 12, wherein the flexible display panel further comprises:
a flexible circuit board disposed on an end of the bend area far away from the display area for transmitting signal.

14. The flexible display according to claim 12, wherein a ratio of the length of the drive controller along the direction parallel to the bend line in the bend area and a length of the bend line is less than ⅔.

15. The flexible display according to claim 12, wherein the flexible substrate defines two side bend lines, the display area is divided into two edge areas and a middle area by the side bend lines, the edge areas and the middle are configured to display image at the same time.

16. The flexible display according to claim 15, wherein the display area is defined in a first curved surface, and the bend area is defined in a second curved surface different from the first curved surface, the distance from a point on the first curved surface to a corresponding point on the second curved surface is fixed and the same.

17. The flexible display according to claim 12, wherein a peripheral drive circuit is disposed the periphery of the display area, and the peripheral drive circuit is used to controls the display area.

18. The flexible display according to claim 12, wherein the flexible substrate is a 3D curved surface bending.

19. The flexible display according to claim 12, wherein the drive controller comprises a plurality of pins, a pin pitch along the direction parallel to the bend line in the bend area is 650 um, and a pin pitch along the direction perpendicular to the bend line is 35 um.

20. The flexible display according to claim 19, wherein the length of the driver controller along the direction parallel to the bend line in the bend area is 9.6 mm, and the length of the drive controller along the direction perpendicular to the bend line is 5.2 mm.

* * * * *